US008860180B2

(12) United States Patent
Jing et al.

(10) Patent No.: US 8,860,180 B2
(45) Date of Patent: Oct. 14, 2014

(54) INDUCTOR STRUCTURE WITH A CURRENT RETURN ENCOMPASSING A COIL

(71) Applicant: Xilinx, Inc., San Jose, CA (US)

(72) Inventors: Jing Jing, San Jose, CA (US); Shuxian Wu, San Jose, CA (US); Parag Upadhyaya, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 7 days.

(21) Appl. No.: 13/661,195

(22) Filed: Oct. 26, 2012

(65) Prior Publication Data

US 2014/0117494 A1 May 1, 2014

(51) Int. Cl.
*H01F 5/04* (2006.01)

(52) U.S. Cl.
USPC ............... 257/531; 257/E21.022; 336/200

(58) Field of Classification Search
CPC ............... H03H 2001/005; H01L 2924/1206
USPC .................... 257/531, E21.022; 336/200
See application file for complete search history.

(56) References Cited

U.S. PATENT DOCUMENTS

| 7,652,355 | B2 | 1/2010 | Lim et al. |
| 8,143,987 | B2 | 3/2012 | Kireev |
| 2004/0038473 | A1* | 2/2004 | Lowther et al. ............. 438/202 |
| 2004/0195692 | A1* | 10/2004 | Adan ........................... 257/758 |
| 2009/0146252 | A1 | 6/2009 | Huang et al. |
| 2009/0152674 | A1* | 6/2009 | Uchida et al. ............... 257/531 |
| 2010/0295648 | A1* | 11/2010 | Huang et al. ................ 336/200 |
| 2011/0309907 | A1 | 12/2011 | Kuroda |
| 2012/0241904 | A1* | 9/2012 | Wu et al. ..................... 257/531 |
| 2012/0242446 | A1 | 9/2012 | Wu et al. |
| 2013/0075859 | A1* | 3/2013 | Kerber ......................... 257/531 |

FOREIGN PATENT DOCUMENTS

EP    1 465 255 A2    10/2004

OTHER PUBLICATIONS

U.S. Appl. No. 13/347,538, filed Jan. 10, 2012, Kireev.
U.S. Appl. No. 13/452,600, filed Apr. 20, 2012, Wu.
Murata, Koji et al., "Effect of a Ground Shield of a Silicon On-Chip Spiral Inductor," Dec. 3, 2000. pp. 177-180, IEEE, Piscataway, New Jersey, USA.

* cited by examiner

*Primary Examiner* — Fernando L Toledo
*Assistant Examiner* — Peter Bradford
(74) *Attorney, Agent, or Firm* — Kevin T. Cuenot; John J. King

(57) ABSTRACT

An inductor structure implemented within a semiconductor integrated circuit includes a coil of conductive material including at least one turn and a current return encompassing the coil. The current return is formed of a plurality of interconnected metal layers of the semiconductor integrated circuit.

15 Claims, 8 Drawing Sheets

INDUCTOR STRUCTURE WITH A CURRENT RETURN ENCOMPASSING A COIL

TECHNICAL FIELD

One or more embodiments disclosed within this specification relate to semiconductor integrated circuits (ICs) and, more particularly, to an inductor structure for use with a semiconductor IC.

BACKGROUND

Semiconductor integrated circuit (IC) technology continues to evolve supporting ever smaller features sizes. Smaller feature sizes facilitate the creation of smaller devices, thereby allowing a larger number of devices to be implemented within a given area of an IC. As devices are implemented closer to one another and the overall number of devices increases within an IC, the number of electrical interactions between the devices also tends to increase.

One example of an electrical interaction is inductive coupling. Inductive coupling can reduce the performance of devices and, in particular, inductors, implemented within an IC. Implementation of inductors within ICs is increasingly important given the high frequency of operation of modern circuits and the need for impedance matching. Many electrical interactions such as inductive coupling, however, are difficult to predict and quantify within ICs implemented using modern IC manufacturing technologies.

SUMMARY

An inductor structure implemented within a semiconductor integrated circuit (IC) includes a coil of conductive material having at least one turn. The inductor structure further includes a current return encompassing the coil. The current return is formed of a plurality of interconnected metal layers of the IC.

An inductor structure implemented within an IC includes a coil of conductive material having at least one turn. The inductor structure also includes a current return encompassing the coil, wherein the current return is formed of a plurality of interconnected metal layers of the IC. The current return further includes at least one via segment connecting each pair of adjacent metal layers of the current return. Each via segment is implemented within a metal layer between each pair of adjacent metal layers of the current return.

BRIEF DESCRIPTION OF THE DRAWINGS

FIG. 6-1 is a first perspective view of an example of a conductor structure for use in forming a current return of an inductor structure.

FIG. 6-2 is a second perspective view of an example of a conductor structure for use in forming a current return of an inductor structure.

FIG. 6-3 is a third perspective view of an example of a conductor structure for use in forming a current return of an inductor structure.

DETAILED DESCRIPTION

While the specification concludes with claims defining novel features, it is believed that the various features disclosed within this specification will be better understood from a consideration of the description in conjunction with the drawings. The process(es), machine(s), manufacture(s) and any variations thereof described within this specification are provided for purposes of illustration. Specific structural and functional details disclosed within this specification are not to be interpreted as limiting, but merely as a basis for the claims and as a representative basis for teaching one skilled in the art to variously employ the features described in virtually any appropriately detailed structure. Further, the terms and phrases used within this specification are not intended to be limiting, but rather to provide an understandable description of the features described.

One or more embodiments disclosed within this specification relate to semiconductor integrated circuits (ICs) and, more particularly, to an inductor structure for use within an IC. An inductor structure can be implemented that includes a current return. The current return ensures that current flowing through the inductor structure traverses a known and predefined path within the IC in which the inductor structure is implemented. The current return is implemented having an impedance that is lower than surrounding IC structures to ensure that current flow traverses through the current return as opposed to through other IC structures that would result in electro-magnetic coupling of the inductor structure with other IC structures, e.g., devices. Reducing electro-magnetic coupling between the inductor structure and other IC structures prevents the inductance of the inductor structure from varying from the intended or designed value. Further, the quality factor, or "Q," of the inductor structure is improved.

For purposes of simplicity and clarity of illustration, elements shown in the Figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

Figure 1:
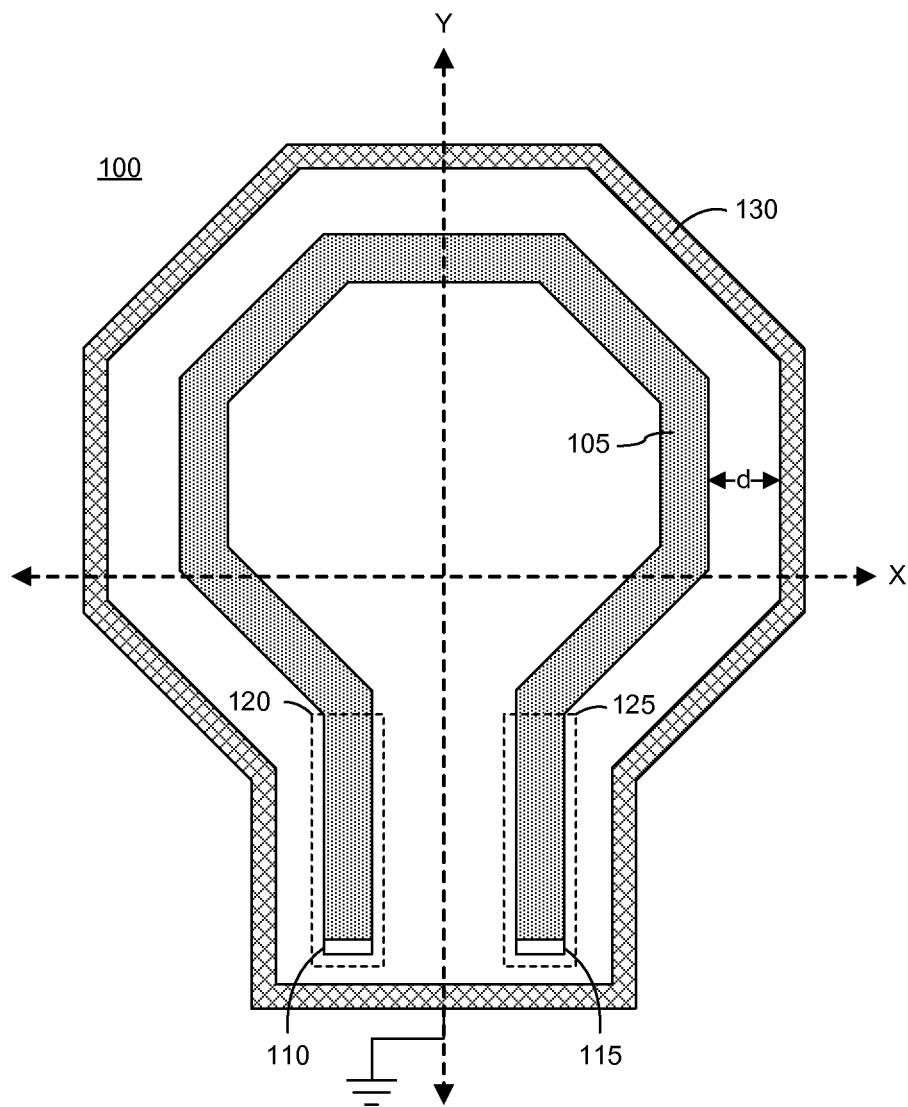
FIG. 1 is a first block diagram illustrating a topographical view of an exemplary inductor structure.

FIG. 1 is a first block diagram illustrating a topographical view of an exemplary inductor structure 100. Inductor structure 100 includes a coil 105 having a first terminal 110 and a second terminal 115. Coil 105 is formed of a conductive material such as metal. More particularly, coil 105 is formed as part of a patterned metal layer, e.g., a trace, within the IC in which inductor structure 100 is implemented. Coil 105 includes an odd number of turns or loops. It should be appreciated that coil 105 can include 1, 3, or some other odd number of turns. In this example, coil 105 includes a single turn. As pictured, coil 105 is generally octagonal in shape. The particular shape of coil 105, however, is not intended to be a limitation. Coil 105 can be implemented in any of a variety of other shapes including, but not limited to, circular, square, rectangular, or the like. Terminal 110 is coupled to the turn portion of coil 105 by a leg 120. Terminal 115 is coupled to the turn portion of coil 105 by a leg 125. In the case where coil 105 includes 3 turns or more (an odd number of turns), each turn of coil 105 will have a same center, e.g., is concentric.

Inductor structure 100 further includes a current return 130. Current return 130 fully encompasses coil 105 and is connected to ground within the particular IC in which inductor structure 100 is implemented. As pictured, current return 130 has a shape, as defined by the outer perimeter, or boundary, of current return 130, or the inner perimeter or boundary of current return 130, that is substantially the same as the shape of coil 105. For example, the distance "d" between the inner boundary of current return 130 and the outer boundary of coil 105 can be constant or substantially constant.

Current return 130 is formed of two or more levels. More particularly, current return 130 is formed of stacked metal levels. In the example pictured in FIG. 1, current return 130 is not physically connected to coil 105 or to either of legs 120 and 125. Each level is formed of a patterned layer of metal of the IC in which inductive structure 100 is implemented. Current return 130, in effect, forms a wall of conductive material, e.g., traces, that surrounds coil 105. As an example, current return 130 includes at least four levels with adjacent levels being connected vertically using a plurality of conductive IC structures such as contacts and/or via elements as the case may be. Forming current return 130 using two or more, e.g., multiple, levels joined using conductive IC structures reduces the impedance of current return 130, thereby ensuring that current traverses through current return 130 as opposed to traversing through one or more other unintended paths through the IC.

An x-axis and a y-axis are superimposed over inductor structure 100 to illustrate various physical aspects. The horizontal x-axis is perpendicular with the vertical y-axis. The y-axis bisects inductor structure 100 so that inductor structure 100 is symmetric with respect to the y-axis. Thus, the portion of inductor structure 100 to the left of the y-axis, referred to as the left side, is a mirror image of the portion of inductor structure 100 to the right of the y-axis, referred to as the right side. The left side of inductor structure 100 includes terminal 110. The right side of inductor structure 100 includes terminal 115.

The x-axis divides inductor structure 100 into two unequal portions. Inductor structure 100 is not symmetric about the x-axis. The portion of inductor structure 100 above the x-axis, referred to as the top portion, is not a mirror image of the portion of inductor structure 100 below the x-axis, referred to as the bottom portion. As pictured, each of legs 120 and 125 is parallel with the y-axis.

Figure 2:
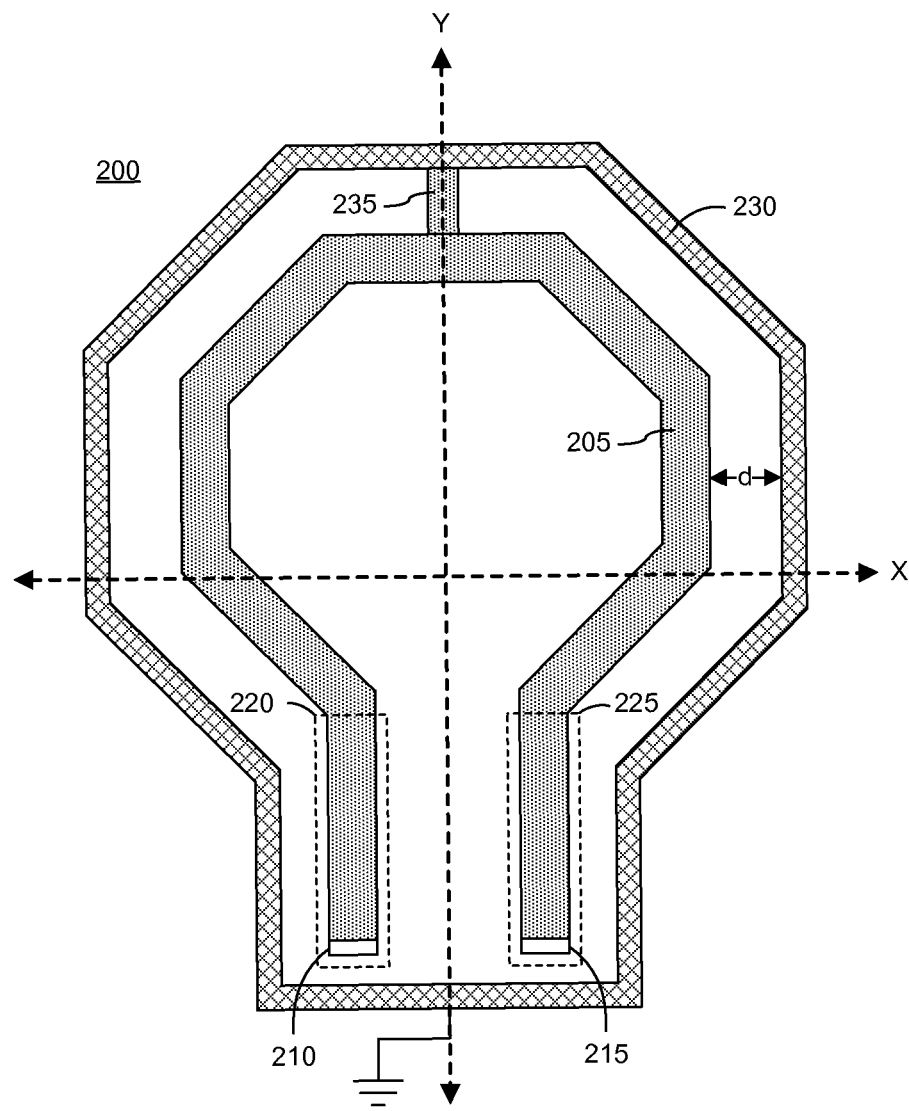
FIG. 2 is a second block diagram illustrating a topographical view of an exemplary inductor structure.

FIG. 2 is a second block diagram illustrating a topographical view of an exemplary inductor structure 200. Inductor structure 200 is implemented substantially the same as inductor structure 100. For example, inductor structure 200 includes a coil 205 having a first terminal 210 and a second terminal 215. Coil 205 includes an odd number of turns or loops. Coil 205 is formed of conductive material as described. It should be appreciated that coil 205 can include 1, 3, or some other odd number of turns. In this example, coil 205 includes a single turn. Coil 205 is, in general, octagonal in shape, but is not limited in this regard. Terminal 210 is coupled to the turn portion of coil 205 by a leg 220. Terminal 215 is coupled to the turn portion of coil 205 by a leg 225. In the case where coil 205 includes 3 turns or more (an odd number of turns), each turn of coil 205 will have a same center, e.g., is concentric.

Inductor structure 200 further includes a current return 230 that is connected to ground. Current return 230 is implemented substantially the same as current return 130 of FIG. 1. For example, current return 230 is formed of stacked metal layers that fully encompass coil 205 and which are connected to ground within the particular IC in which inductor structure 200 is implemented. Unlike current return 130 of FIG. 1, however, current return 230 is physically connected to coil 205 by a connector 235.

Connector 235 is connected to a midpoint of coil 205. Thus, connector 235 is equidistance in terms of the length of coil 205 from terminal 210 and from terminal 215. Connector 235 is formed of metal. For example, connector 235 is formed using the same metal layer in which coil 205 is formed. In this regard, current return 230 can include at least one level that is formed of the same metal layer that is used to form coil 205 and/or connector 235 as a continuous portion of metal. Thus, at least one level of current return 230, coil 205, and connector 235 is formed of a single, continuous portion of metal that is patterned within a same metal layer of the IC. Due to the multi-level formation of current return 230, current return 230 extends above coil 205, below coil 205, or both above and below coil 205 depending upon the particular metal layer used to implement coil 205 and connector 235.

An x-axis and a y-axis are superimposed over inductor structure 200 to illustrate various physical aspects. The horizontal x-axis is perpendicular with the vertical y-axis. The y-axis bisects inductor structure 200 so that inductor structure 200 is symmetric with respect to the y-axis. Thus, the portion of inductor structure 200 to the left of the y-axis is a mirror image of the portion of inductor structure 200 to the right of the y-axis. The left side of inductor structure 200 includes terminal 210. The right side of inductor structure 200 includes terminal 215.

The x-axis divides inductor structure 200 into two unequal portions. Inductor structure 200 is not symmetric about the x-axis. The portion of inductor structure 200 above the x-axis, referred to as the top portion, is not a mirror image of the portion of inductor structure 200 below the x-axis, referred to as the bottom portion. In a configuration in which coil 205 has an odd number of turns as pictured in FIG. 2, connector 235 is located in a different side of the x-axis, i.e., the top portion, while terminals 210 and 215 are located in another, i.e., the bottom portion. As pictured, each of legs 210 and 215 is parallel with the y-axis. The y-axis also bisects connector 235.

Figure 3:
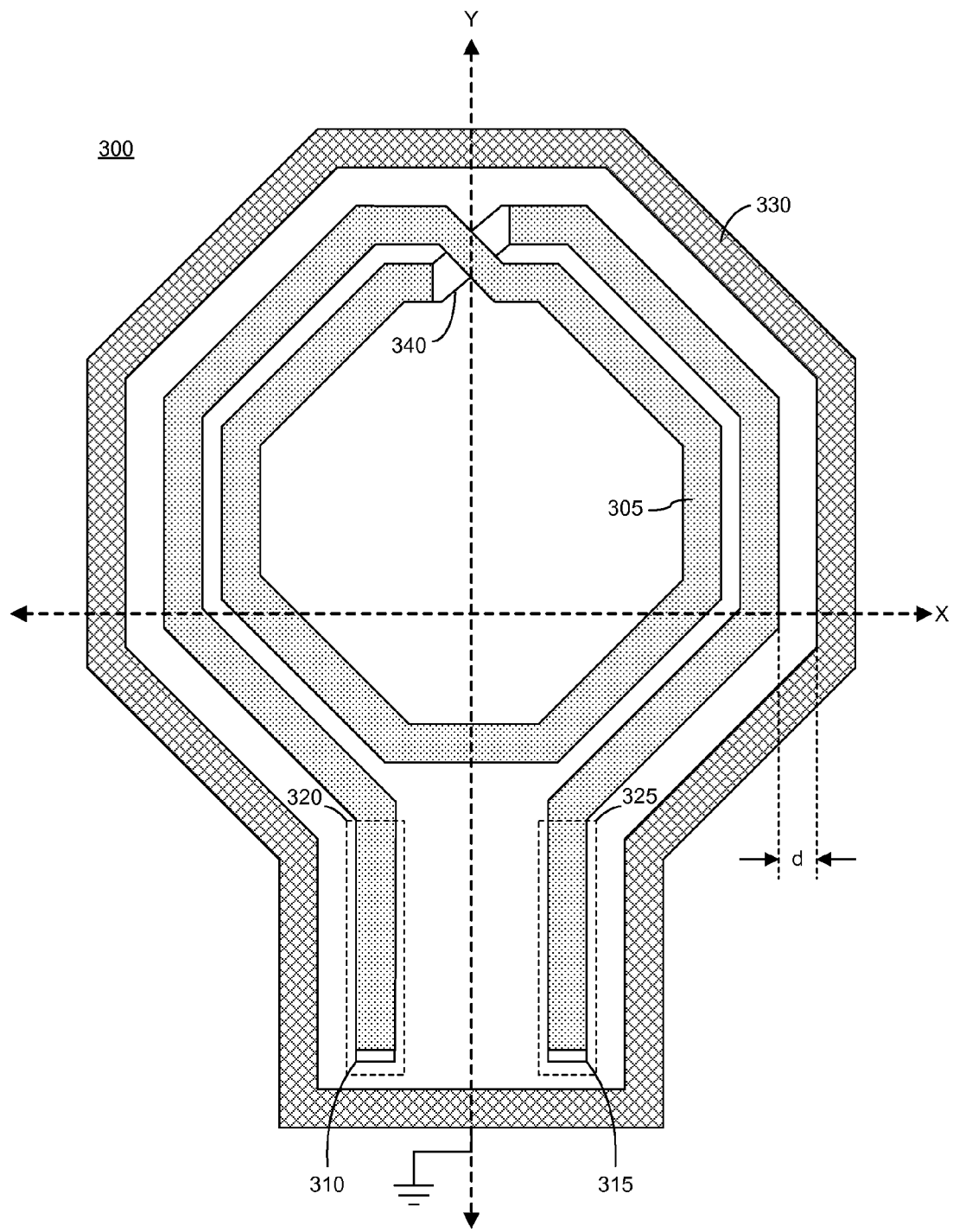
FIG. 3 is a third block diagram illustrating a topographical view of an exemplary inductor structure.

FIG. 3 is a third block diagram illustrating a topographical view of an exemplary inductor structure 300. Inductor structure 300 includes a coil 305 having a first terminal 310 and a second terminal 315. Coil 305 includes an even number of turns or loops. In this example, coil 305 includes two turns. It should be appreciated that coil 305 can include 2, 4, or some other even number of turns. Terminal 310 is coupled to the turn portion of coil 305 by a leg 320. Terminal 315 is coupled to the turn portion of coil 305 by a leg 325.

Coil 305 is formed using conductive material and, more particularly, within two metal layers of the IC in which inductor structure 300 is implemented. In general, both turns of coil 305 are located in a same metal layer of the IC. Bridge portion 340 is implemented in a different metal layer and connected to coil 305 by vertical, conductive IC structures such as contacts and/or via elements. Bridge 340 allows coil 305 to be implemented as two continuous turns. As illustrated, each turn of coil 305 is generally octagonal in shape. The particular shape of coil 305, however, is not intended to be a limitation. Coil 305 can be implemented in any of a variety of other shapes including, but not limited to, circular, square, rectangular, or the like. As pictured in FIG. 3, each turn of coil 305 has a same center, e.g., is concentric, in that the inner turn is centered with respect to the outer turn of coil 305.

Inductor structure 300 further includes a current return 330. Current return 330 is not physically connected to coil 305, leg 320, or leg 325. Current return 330 encompasses coil 305. As pictured, current return 330 has a shape, as defined by the outer perimeter, or boundary, of current return 330, or the inner perimeter or boundary of current return 330 that is substantially the same as the shape of coil 305. As illustrated, the distance "d" between the inner boundary of current return 330 and the outer boundary of coil 305 can be constant or substantially constant.

Current return 330 is formed of one or more levels as described with reference to FIGS. 1 and 2, with each level being formed of a patterned layer of metal of the IC in which inductive structure 300 is implemented. In one example, current return 330 includes at least four levels, with adjacent levels being connected vertically using a plurality of conductive IC structures such as contacts and/or via elements as the case may be.

An x-axis and a y-axis are superimposed over inductor structure 300 to illustrate various physical aspects. The horizontal x-axis is perpendicular with the vertical y-axis. The y-axis bisects inductor structure 300 so that inductor structure 300 is symmetric about the y-axis. The left side of inductor structure 300 is a mirror image of the right side of inductor structure 300. The left side of inductor structure 300 includes terminal 310. The right side of inductor structure 300 includes terminal 315.

The x-axis divides inductor structure 300 into two unequal portions. Inductor structure 300 is not symmetric about the x-axis in that the top portion of inductor structure 300 is not a mirror image of the bottom portion of inductor structure 300.

Figure 4:
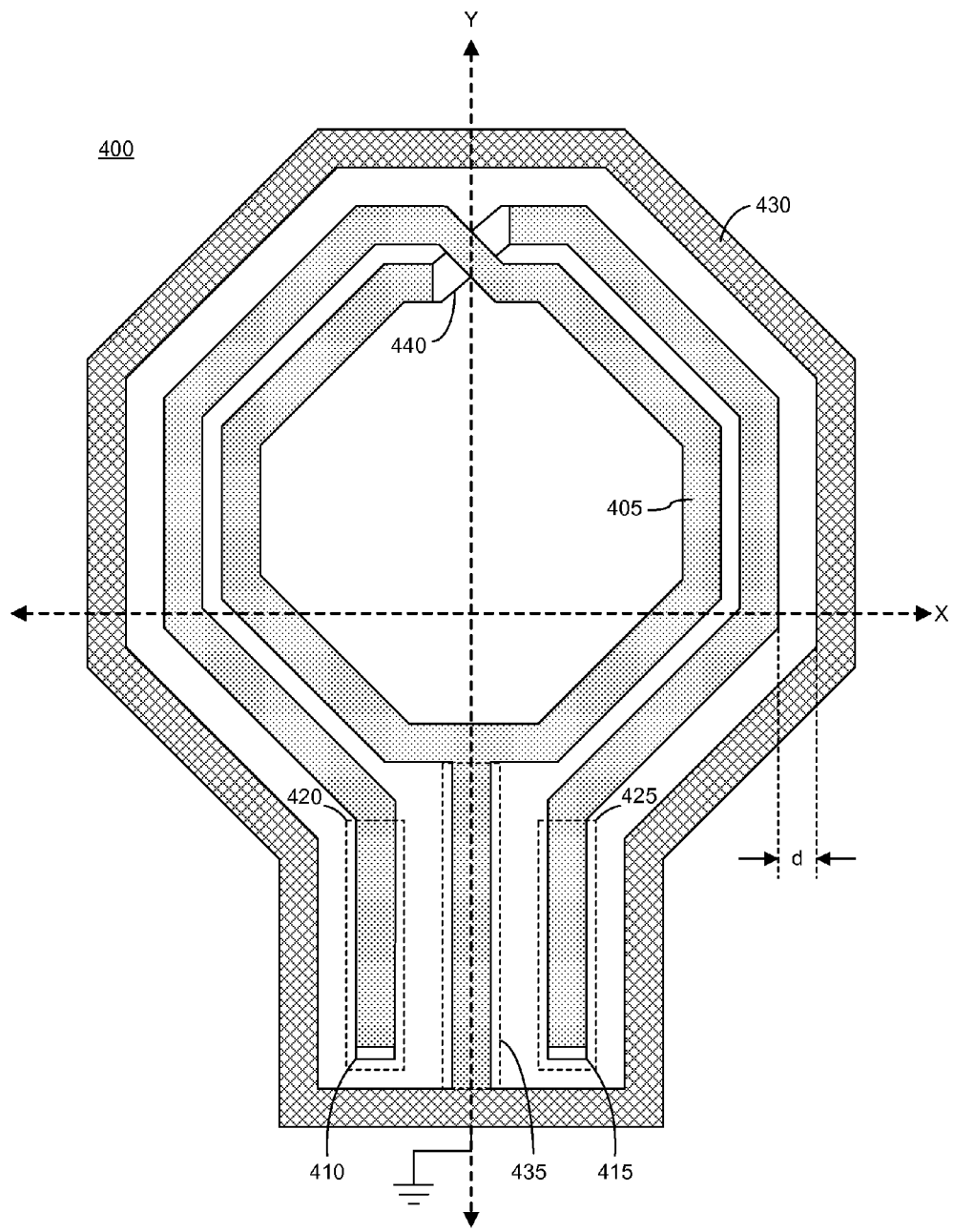
FIG. 4 is a fourth block diagram illustrating a topographical view of an exemplary inductor structure.

FIG. 4 is a fourth block diagram illustrating a topographical view of an exemplary inductor structure 400. Inductor structure 400 is substantially similar to inductor structure 300 of FIG. 3. For example, inductor structure 400 includes a coil 405 formed of conductive material, e.g., using metal layers. Coil 405 has a first terminal 410 and a second terminal 415. Coil 405 includes an even number of turns or loops. In this example, coil 405 includes two turns. It should be appreciated that coil 405 can include 2, 4, or some other even number of turns. Terminal 410 is coupled to the turn portion of coil 405 by a leg 420. Terminal 415 is coupled to the turn portion of coil 405 by a leg 425.

Inductor structure 400 further includes a current return 430 substantially the same as current return 330 of FIG. 3. For example, current return 430 is formed of stacked metal layers and encompasses coil 405. Unlike current return 330, however, current return 430 is physically connected to coil 405 by a connector 435. Connector 435 is connected to a midpoint of coil 405. Connector 435 is formed of metal. For example, connector 435 is formed using the same metal layer in which coil 405 is formed. In this regard, current return 430 can include at least one level that is formed of the same metal layer that is used to form coil 405 and/or connector 435. Thus, at least one level of current return 430, coil 405, and connector 435 is formed of a single, continuous portion of metal that is patterned within a same metal layer of the IC. Due to the multi-level formation of current return 430, current return 430 extends above coil 405, below coil 405, or both above and below coil 405 depending upon the particular metal layer used to implement coil 405.

An x-axis and a y-axis are superimposed over inductor structure 400 to illustrate various physical aspects. The horizontal x-axis is perpendicular with the vertical y-axis. The y-axis bisects inductor structure 400 so that inductor structure 400 is symmetric about the y-axis. The left side of inductor structure 400 is a mirror image of the right side of inductor structure 400. The left side of inductor structure 400 includes terminal 410. The right side of inductor structure 400 includes terminal 415.

As pictured, connector 435 effectively forms a third leg portion of coil 405. Connector 435 is located between each of legs 420 and 425. Connector 435 is parallel with legs 420 and 425, as well as with the y-axis. As illustrated, the y-axis further bisects connector 435.

The x-axis divides inductor structure 400 into two unequal portions. Inductor structure 400 is not symmetric about the x-axis in that the top portion of inductor structure 400 is not a mirror image of the bottom portion of inductor structure 400. In the configuration shown in FIG. 4 in which coil 405 has an even number of turns, connector 435 is located on a same side of the x-axis, i.e., the bottom portion, as terminals 410 and 415.

The various inductor structures have been illustrated as being octagonal in shape. It should be appreciated that the particular shape of the inductor structure and, in particular, the coils, can vary. In some applications the coil has a circular shape, while in others the coil is square or rectangular in shape. The particular number of turns and the shape of coil used dictates whether the terminals of the inductor structure are located on the same side, e.g., above, below, or on opposite sides of the x-axis and/or y-axis. For example, a square coil will generally have both terminals located on a same side of the x-axis for whole turns, whereas for a half turn or any other number of turns including a half turn, e.g., 1.5, 2.5, etc., the terminals will be located on opposing sides of the x-axis. Further, regardless of the particular shape of the coil and/or current return, the inductor structure can be formed to include a connector that physically connects the coil with the current return or formed so that the coil is not physically connected to the current return.

Figure 5:
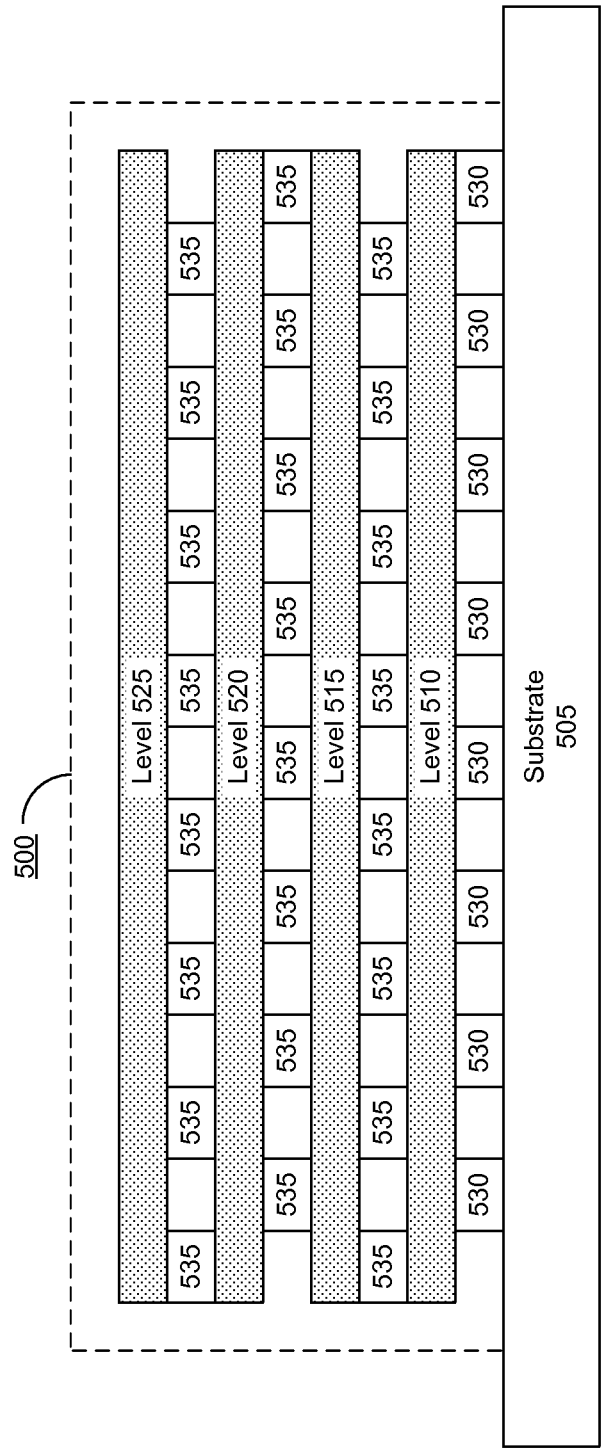
FIG. 5 is a fifth block diagram illustrating a side view of an exemplary current return for an inductor structure.

FIG. 5 is a fifth block diagram illustrating a side view of an exemplary current return 500 for an inductor structure. Current return 500 illustrates the multi-level stacking approach described with reference to the current returns of FIGS. 1-4. As illustrated, current return 500 is implemented on a substrate 505 and includes a plurality of levels. In this example, current return 500 includes four levels 510, 515, 520, and 525. Each level is implemented using a patterned metal layer to form traces. As known, each metal layer, and thus level, is separated from each other metal layer by an insulating material except for those portions occupied by a via element used to connect adjacent ones of levels 510-525.

Levels 510-525 are vertically stacked and share a common center. Level 510 is connected to substrate 505 through contacts 530. Levels 510 and 515, levels 515 and 520, and levels 520 and 525 are vertically connected by via elements 535. As noted, the coil portion (obstructed from view within current return 500) of the inductor structure is formed using one or more of the same metal layers used to form levels 510, 515, 520, and/or 525. In one example, via elements 535 are spaced according to a minimum allowed spacing based upon design rules for the particular IC manufacturing technology used to implement the current return.

For example, in the case of a coil having a single turn, the coil can be implemented in any one of the metal layers used to implement levels 510-525. In the case of a two-turn coil, the turns can be implemented in any of the metal layers used to implement levels 510-525. The bridge portion, for example, also can be implemented using a same metal layer as used for one of levels 510-525. Thus, for example, when the turns are implemented in the same metal layer used to implement level 525, the bridge can be implemented using the metal layer used to implement level 520. When the turns are implemented in the same metal layer used to implement level 510, the bridge can be implemented using the metal layer used to implement level 515.

FIG. 5 illustrates conventional vias. Other types of via elements can be used such as "trench vias." FIGS. 6-7 illustrate various conductor structures that utilize via elements of the "trench" variety that can be stacked to form a wall and used to implement a current return substantially as described within this specification for an inductor structure.

Figures 1, 6:
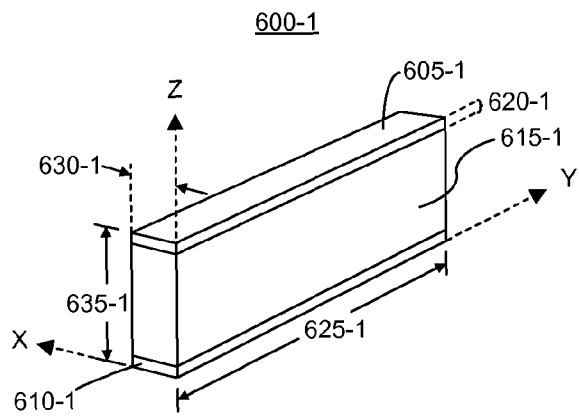
Figures 2, 6:
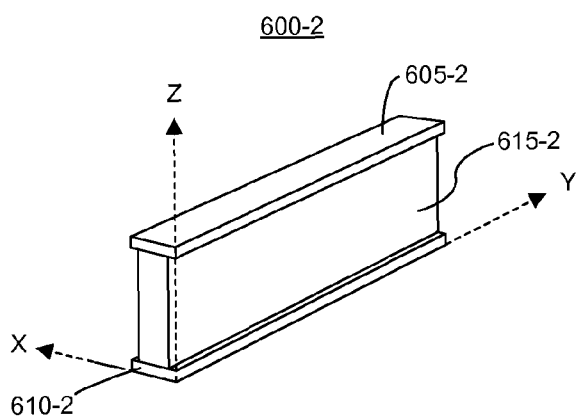
Figures 3, 6:
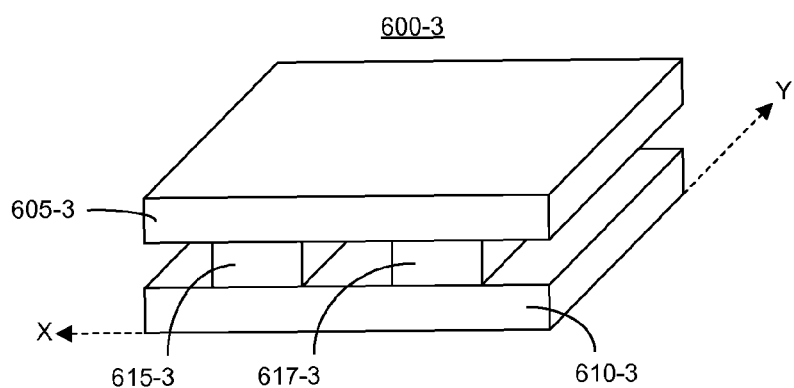
Figure 7:
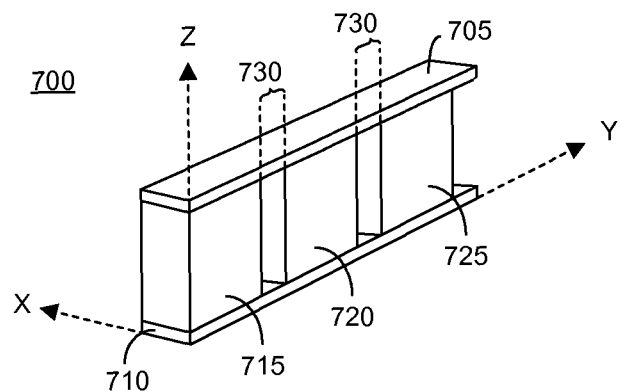
FIG. 7 is a fourth perspective view of an example of a conductor structure for use in forming a current return of an inductor structure.

FIG. 6-1 is a first perspective view of an example of a conductor structure 600-1 for use in forming a current return of an inductor structure. Conductor structure 600-1 is an example of a conductor that can be implemented within an IC, e.g., in package substrate. As pictured, conductor structure 600-1 is an integrated conductor structure that can include, or be formed of, one or more metal layers such as traces 605-1 and 610-1 in which adjacent ones of traces are separated by a via segment 615-1.

Trace 605-1 can be implemented using a first metal layer. Trace 610-1 can be implemented using a second and different metal layer. Each metal layer can be implemented parallel to the plane defined by the x-axis and the y-axis. In general, trace 605-1 and trace 610-1 can be formed by removing portions of each respective metal layer through an IC manufacturing process leaving behind a "patterned layer" forming trace 605-1 and trace 610-1.

Trace 605-1 and trace 610-1 can be separated by an insulating layer. In some cases, the insulating layer separating two consecutive conductive layers is referred to as a via layer. Examples of dielectric materials that can be used can include, but are not limited to, the prepreg type including those with supporting glass fiber, film types including ABF film, or ceramic types.

The via layer can be used to form one or more via elements that can be configured to electrically couple trace 605-1 to trace 610-1. In general, a "via element" refers to a vertical electrical connection between different layers of conductors, or conductive layers, in an electrical circuit. In some cases, e.g., within ICs, the term "via" can refer to an opening formed within the insulating layer within which conductive material can be formed to implement the vertical electrical connection. As used within this specification, the terms "via," "via element," and "via segment" refer to the vertical, physical and electrical connection as opposed to simply the opening in which a connection is formed.

For purposes of illustration and ease of description, the phrase "via element" is used to refer to both a conventional via and a via segment (e.g., a "trench via"). The phrase "via segment" is used to refer to a via that is shaped in a free form manner that is not restricted to a column, cylinder, plug, or dot (substantially spherical) shape that is characteristic of a conventional via. A via segment, for example, can be formed as a trace, a cube, a cuboid, a rectangular cuboid, a plane, or the like that is formed in an insulating layer. The term "via" is used to refer to a conventional via.

In one aspect, via segments can be formed using a process in which the various metal layers used to form trace 610-1, via segment 615-1, and trace 605-1 are formed using a series of patterned metal layers. Each layer can be formed as a patterned metal layer including, for example, the layer in which via segment 615-1 is formed. Layers can be formed using photoresist technology, thereby allowing free-form shapes of via segment 615-1 to be formed, as is the case for each of traces 605-1 and 610-1. In this regard, the layer in which via segment 615-1 is formed is created from a metal layer that is separate from and different than the metal layers used to form traces 605-1 and 610-1. Subsequent to formation of the stacked structure of the metal layers in which trace 605-1, via segment 615-1, and trace 610-1 are formed, excess material (e.g., metal) can be removed to form conductor structure 600-1, which can be constructed on a surface of a base material or substrate, for example. Subsequently, insulating material as described, e.g., an oxide dielectric material, can be filled in surrounding conductor structure 600-1. Thus, via segments are formed as described with insulating material backfilled after formation as opposed to other varieties of vias in which holes are formed in insulating material and the hold then filled.

For purposes of illustration, various types of metal layers are not illustrated in FIG. 6. For example, metal adhesion layers that may be included to facilitate improved adhesion between metal layers and dielectric material are not shown. Further, barrier metal layers that may be included are not shown. In illustration, a first metal adhesion layer can be formed below trace 610-1 and a second metal adhesion layer formed between trace 605-1 and via segment 615-1. A barrier metal layer can be formed between trace 610-1 and via segment 615-1, or the like. It should be appreciated that the examples provided for constructing conductor structure 600-1 are provided for purposes of illustration and, as such, are not intended as limitations. Other techniques can be used to form conductor structure 600-1.

As pictured in FIG. 6-1, via segment 615-1 can be a rectangular cuboid in shape and have a length 625-1 that exceeds a width 630-1. In general, trace 605-1 is vertically aligned with trace 610-1. Trace 605-1 further can be shaped substantially similar to, if not the same as, trace 610-1, e.g., have a same width and height. Via segment 615-1 can have a same width as traces 605-1 and 610-1. Via segment 615-1 can be vertically aligned with both trace 605-1 and trace 610-1. Further, via segment 615-1 is in contact with an under surface of trace 605-1 and is in contact with a top surface of trace 610-1. In the example pictured, via segment 615-1 is formed in a rectangular shape that coincides with the length-wise shape and direction of trace 605-1 and trace 610-1. With via segment 615-1 formed in this manner, e.g., shaped as a trace, conductor structure 600-1 forms an integrated conductor structure that includes trace 605-1, trace 610-1, and via segment 615-1. It should be appreciated that trace 605-1, trace 610-1, and via segment 615-1 can be vertically aligned so that when viewed from overhead, a single conductor appears (e.g., only trace 605-1 is viewable) as each follows a same signal path or template that can travel any of a variety of directions in the x-y plane as part of the integrated conductor structure 600-1.

In general, a via segment such as via segment 615-1 is characterized in that the shape of the via segment can correspond to the shape or path taken by a trace in any of a variety of directions in the x-y plane. For example, traces 605-1 and 610-1 can extend and bend in any of a variety of angles, e.g., 45 and/or 90 degrees, within the x-y plane with via segment 615-1 implemented to follow that same path.

The length of the via segment generally will exceed the width and can exceed the width by a substantial amount. A via segment, for instance, can have a rectangular or square cross-section taken in the x-z plane. A via segment can have a rectangular (and in some instances square) cross-section taken in the x-y plane. For example, the length of a via segment can be twice, three times, or more, the width of the via segment. Thus, referring to the coordinate system of FIG. 6-1, a via segment can be longer in a direction (y-direction)

that is parallel to the traces above and below forming the conductor structure than in a direction perpendicular thereto (e.g., either one or both of the x and z-directions). It further should be appreciated that while the via elements are generally illustrated with sharp, e.g., 90 degree, corners, the edges of via elements can be smoothed or rounded.

By comparison, a via will have a cross-section in the x-y plane that is circular or round in shape. Further, a via typically has a different diameter at the top of the via than at the bottom of the via. Thus, the cross section of a via in the x-z plane is not square or rectangular.

The overall height 635-1 of conductor structure 600-1, as shown, exceeds the height 620-1 of a single trace (e.g., trace 605-1) alone as is typically used to form a conductor. The resulting height 635-1 of conductor structure 600-1 includes twice the height 620-1 of a single trace plus the height of via segment 615-1. The resulting cross-sectional area of conductor structure 600 provides increased surface area over that of a single trace. This increased surface area means that conductor structure 600-1 is less susceptible to the skin effect and provides improved performance as a high frequency conductor.

In general, conductor structure 600-1 can be characterized by the direction in which electrical signals are propagated therein. Conductor structure 600-1 can carry signals in any direction parallel to the x-y plane as opposed to a direction parallel to the z-axis (and perpendicular to the x-y plane). Thus, conductor structure 600-1 can be used to propagate signals in the plane parallel to the layers used to create the integrated circuit in which conductor structure 600-1 is included as opposed to conveying signals in the vertical direction as is the case with conventional via technology.

FIG. 6-2 is a second perspective view of an exemplary conductor structure 600-2 for use in forming a current return of an inductor structure. Conductor structure 600-2 can be implemented substantially as described with reference to FIG. 6-1 and conductor structure 600-1, with the exception that via segment 615-2 has a width (or diameter) that is narrower than the width of trace 605-2 and trace 610-2. Thus, each of traces 605-2 and 610-2 can be said to "overhang" via segment 615-2. Via segment 615-2 still can be vertically aligned with both trace 605-2 and trace 610-2, creating an I-beam type of architecture.

In one aspect, the lesser width of via segment 615-2 compared to traces 605-2 and 610-2 can be a result of a particular process technology. Further, the lesser width of via segment 615-2 can be maintained within a particular range, e.g., percentage of the width of traces 605-2 and/or 610-2. For example, traces 605-2 and 610-2 can be approximately 60 μm in width while via segment 615-2 is approximately 40 μm in width. It should be appreciated that the particular widths disclosed herein are provided for purposes of illustration only and, as such, are not intended as limitations of the one or more examples disclosed herein.

FIG. 6-3 is a third perspective view of an exemplary conductor structure 600-3 for use in forming a current return of an inductor structure. Conductor structure 600-3 includes a trace 605-3 and a trace 610-3. Rather than including a single via segment, conductor structure 600-3 includes a plurality of via segments placed in parallel. As shown, via segment 615-3 and 617-3 are located between traces 605-3 and 610-3. Via segments 615-3 and 617-3 are placed in parallel with one another and with the y-axis. It should be appreciated that, as pictured in FIG. 6-3, conductor structure 600-3 can continue in either direction along the y-axis.

FIG. 7 is a fourth perspective view of an example of a conductor structure 700 for use in forming a current return of an inductor structure. Conductor structure 700 is an example of a conductor that can be implemented within an IC. As pictured, conductor structure 700 is an integrated conductor structure that can include a trace (e.g., a first trace) 705, a trace (e.g., a second trace) 710, and a plurality of via segments 715, 720, and 725.

Conductor structure 700 can be substantially similar to conductor structure 600 of FIG. 6 in terms of dimensions and structural aspects relating to the traces. Unlike conductor structure 600, however, a plurality of via segments are used as opposed to a single, continuous via segment. In one aspect, each of via segments 715-725 can be a same, or a substantially same, length. The length of each of via segments 715-725 in the y-direction still can exceed the width of each of via segments 715-725 in the x-direction. In one aspect, however, rather than via segments 715-725 being rectangular cuboid in shape, via segments 715-725 can be cubic. Via segment 715 can be separated from via segment 720 by a distance or spacing denoted as 730. Similarly, via segment 720 can be separated from via segment 725 by the distance or spacing 730. In one example, spacing 730 is a minimum allowed spacing based upon design rules for the particular IC manufacturing technology used to implement the current return. It should be appreciated that conductor structure 700 can be implemented to continue with further via segments and by extending traces 705 and 710 in the y-direction to achieve a desired length. As discussed, conductor structure 700 can continue in any direction within the x-y plane and the continuance in a particular direction, e.g., the y-direction, is for purposes of illustration only.

In one aspect, the length of each of via segments 715-725 can be limited to ensure that conductor structure 700 maintains physical integrity. For example, each of via segments 715-725 can be limited in length to approximately 2 millimeters. The distance or spacing 730, for example, can be approximately 100 μm. In another example, the spacing can be approximately 180 μm, 200 μm, or the like. Accordingly, conductor structure 700 illustrates an integrated conductor structure in which trace 705 and trace 710 are continuous, but in which the via segment is not.

It should be appreciated that the maximum length of a via segment is a function of the particular electrical circuit fabrication technology that is used and other structural considerations relating to stress effects and the like upon the electrical circuit. As such, the 2 millimeter restriction on length for a via segment and the 100 μm spacing between via segments are provided for purposes of illustration only and are not intended as limitations of the embodiments disclosed within this specification.

In another aspect, the spacing between consecutive pairs of via segments need not be the same. For example, in some cases, the spacing can be irregular in that the spacing between a first pair of consecutive via segments can be different from the spacing between a second (next) pair of consecutive via segments. In some cases, the spacing can be determined according to desired electrical properties, e.g., loss and/or impedance of conductor structure 700. Further, presuming that mechanical (e.g., physical) requirements of conductor structure 700 are met in terms of spacing to avoid fractures or other unintended mechanical discontinuities in the via segments, the spacing between via segments can be made greater or smaller to vary impedance of conductor structure 700. Similarly, via segments can be of varying length to achieve a desired impedance.

Figure 8:
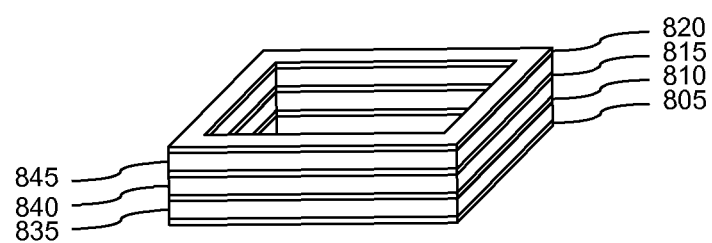
FIG. 8 is a fifth perspective view of an exemplary current return formed using via segments as described with reference to FIG. 6.

FIG. 8 is a fifth perspective view of an exemplary current return 800 formed using via segments as described with reference to FIG. 6. Current return 800 is formed in a rectangular shape and, more particularly, as a square to accommodate a square shaped coil. As pictured, current return 800 includes traces 805, 810, 815, and 820 formed of stacked, patterned metal layers. Via segment 835 is located between traces 805 and 810. Via segment 840 is located between traces 810 and 815. Via segment 845 is located between traces 815 and 820. A connector is not illustrated, but can be included as described within this specification with reference to FIGS. 2 and 4.

While FIG. 8 illustrates the formation of an exemplary current return using via segments as described with reference to FIG. 6, it should be appreciated that the via segments also can be formed as illustrated and described with reference to FIG. 7 in which multiple via segments are included in each layer between adjacent traces and where the via segments have a predefined spacing.

Figure 9:
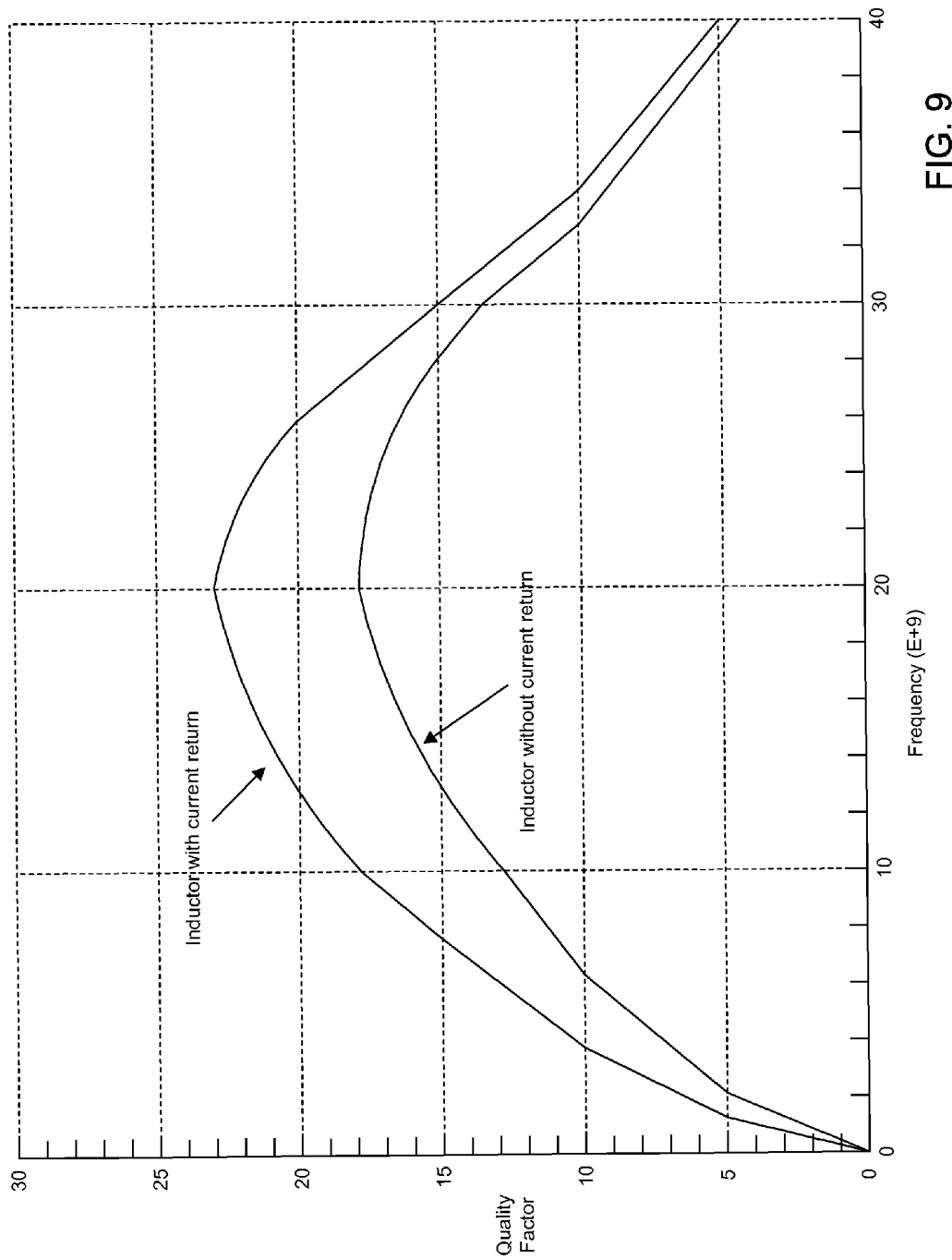
FIG. 9 is a graph illustrating the quality factor (Q) for different inductor structures.

FIG. 9 is a graph illustrating the quality factor (Q) for different inductor structures. FIG. 9 illustrates test data for two different inductor structures. One inductor structure includes a current return (whether physically connected to the coil or not), while the other inductor structure does not. The graph pictured in FIG. 9 has been smoothed and, as such, presents an approximation of test results obtained from test inductor structures implemented using a 28 nanometer, high performance low power (HPL) process. As illustrated, the Q factor for the inductor structure having a current return is increased by approximately 25% over the inductor structure without a current return in some cases. The presence or absence of a connector physically connecting the coil to the current return of the inductor structure does not affect the Q in a significant manner. In addition, the inductor structure having a current return further has an inductive value that has greater stability over the inductor structure without the current return.

The inclusion of a current return, as described within this specification, reduces, or substantially eliminates, inductive coupling between the inductor structure and other neighboring IC devices, including other inductive structures. This reduction in inductive coupling allows inductor structures with current returns to be placed closer together within an IC than would be possible were a current return not utilized. For example, inductor structures having a current return can be placed approximately 10 μm apart, while inductor structures without a current return are typically placed at least 200 μm apart.

For purposes of explanation, specific nomenclature is set forth to provide a thorough understanding of the various inventive concepts disclosed herein. The terminology used herein, however, is for the purpose of illustrating the features described and is not intended to be limiting. For example, the terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system. The term "connected" means that the elements that are connected are physically coupled to one another.

The term "and/or" as used herein refers to and encompasses any and all possible combinations of one or more of the associated listed items. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The corresponding structures, materials, acts, and equivalents of all means or step plus function elements in the claims below are intended to include any structure, material, or act for performing the function in combination with other claimed elements as specifically claimed.

The features disclosed within this specification can be embodied in other forms without departing from the spirit or essential attributes thereof. Accordingly, reference should be made to the following claims, rather than to the foregoing specification, as indicating the scope of such features and implementations.

What is claimed is:

1. An inductor structure implemented within a semiconductor integrated circuit (IC), the inductor structure comprising:
   a coil of conductive material comprising at least one turn;
   a current return encompassing the coil; and
   a connector connecting the coil and the current return;
   wherein the current return is formed of a plurality of interconnected metal layers of the semiconductor integrated circuit; and
   wherein a same metal layer is used to form at least a portion of the coil, at least one metal layer of the current return, and the connector as a continuous portion of metal.

2. The inductor structure of claim 1, wherein the connector connects a midpoint of the coil to the current return.

3. The inductor structure of claim 1, wherein the current return comprises:
   at least one via segment connecting each pair of adjacent metal layers of the current return; and
   wherein each via segment is implemented within a metal layer between each pair of adjacent metal layers of the current return.

4. The inductor structure of claim 1, wherein each pair of adjacent metal layers of the current return are connected by a plurality of via elements having a minimum allowed spacing according to design rules for an integrated circuit manufacturing technology used to implement the current return.

5. The inductor structure of claim 1, wherein the coil comprises an odd number of turns.

6. The inductor structure of claim 1, wherein the coil comprises an even number of turns.

7. The inductor structure of claim 1, wherein an outer boundary of the current return is shaped substantially similar to the coil.

8. The inductor structure of claim 1, wherein the current return comprises at least four levels.

9. The inductor structure of claim 1, wherein the coil and the current return are symmetric about a first axis bisecting the inductor structure.

10. The inductor structure of claim 2, wherein:
   the connector has an orientation aligned with a first axis bisecting the inductor structure;
   the coil and the current return are symmetric about the first axis;
   the coil comprises an odd number of turns and two terminals; and the connector connects the coil and the current return at a location on the coil that is opposite the two terminals of the coil.

11. An inductor structure implemented within a semiconductor integrated circuit (IC), the inductor structure comprising:
  a coil of conductive material comprising at least one turn;
  a current return encompassing the coil, and
  a connector connecting the coil and the current return;
  wherein the current return comprises:
    a plurality of interconnected metal layers of the semiconductor integrated circuit; and
    at least one via segment connecting each pair of adjacent metal layers of the current return;
    wherein each via segment is implemented within a metal layer between each pair of adjacent metal layers of the current return; and
  wherein a same metal layer is used to form at least a portion of the coil, at least one metal layer of the current return, and the connector as a continuous portion of metal.

12. The inductor structure of claim 11, wherein the connector connects a midpoint of the coil to the current return.

13. The inductor structure of claim 11, wherein an outer boundary of the current return is shaped substantially similar to the coil.

14. The inductor structure of claim 11, wherein:
  the coil comprises a first terminal and a second terminal on opposing sides of a first axis bisecting the inductor structure in which the coil and the current return are symmetric about the first axis; and
  the first and second terminals are located on a first side and the connector is located on a second side of a second axis bisecting the inductor and perpendicular to the first axis.

15. The inductor structure of claim 11, wherein:
  the coil comprises a first terminal and a second terminal on opposing sides of a first axis bisecting the inductor structure in which the coil and the current return are symmetric about the first axis; and
  the first and second terminals are located on a same side as the connector of a second axis bisecting the inductor and perpendicular to the first axis.

* * * * *